United States Patent

Shirasaka et al.

[11] Patent Number: 5,323,411
[45] Date of Patent: Jun. 21, 1994

[54] LASER DIODE ARRAY DEVICE

[75] Inventors: Yusei Shirasaka, Yokohama; Masayuki Iwase, Tokyo, both of Japan

[73] Assignee: The Furukawa Electric Co., Ltd., Tokyo, Japan

[21] Appl. No.: 978,261

[22] Filed: Nov. 20, 1992

[30] Foreign Application Priority Data

Nov. 22, 1991 [JP] Japan .................................. 3-334024
Nov. 22, 1991 [JP] Japan .................................. 3-334025
Mar. 3, 1992 [JP] Japan .................................. 4-081624

[51] Int. Cl.$^5$ ............................ H01S 3/18; H01S 3/19
[52] U.S. Cl. ................................... 372/43; 372/49; 372/50; 372/97; 372/99
[58] Field of Search ....................... 372/43, 45, 47, 48, 372/49, 50, 97, 99, 101, 108

[56] References Cited

U.S. PATENT DOCUMENTS

| | | | |
|---|---|---|---|
| 4,608,697 | 8/1986 | Coldren | 372/50 |
| 4,794,609 | 12/1988 | Hara et al. | 372/50 |
| 4,869,780 | 9/1989 | Yang et al. | 372/50 X |
| 4,911,765 | 3/1990 | Song et al. | 372/50 X |
| 4,989,214 | 1/1991 | Kwa | 372/50 |
| 5,032,879 | 7/1991 | Buchmann et al. | 372/50 X |
| 5,136,604 | 8/1992 | Paoli | 372/50 |
| 5,237,636 | 8/1993 | Harada | 372/50 X |
| 5,252,513 | 10/1993 | Paoli et al. | 372/50 X |
| 5,258,991 | 11/1993 | Peterson | 372/50 |
| 5,262,656 | 11/1993 | Blondeau et al. | 372/50 X |

*Primary Examiner*—Brian Healy
*Attorney, Agent, or Firm*—Jacobson, Price, Holman & Stern

[57] ABSTRACT

A laser diode array device (1, 11) according to a first aspect of the invention comprises a plurality of laser diode elements, some of which are formed as monitor laser diode elements for controlling the optical output of the remaining laser diode elements so that the device can operate at a power consumption rate by far lower than that of a conventional laser diode array device where the component laser diode elements needs to be individually controlled, while it can be assembled to an enhanced density. A laser diode array device (21) according to a second aspect of the invention comprises laser diode elements for signal transmission and monitor laser diode elements realized in the form of resonant cavities having a same length and sharing a common reflecting surface of a high-reflection film disposed at an end thereof so that the laser diode elements for signal transmission and the monitor laser diode elements show substantially identical light emitting characteristics.

6 Claims, 4 Drawing Sheets

Direction Of Optical Signal Output

LASER DIODE ARRAY DEVICE

BACKGROUND OF THE INVENTION

1. Field of the Invention

This invention relates to a laser diode array device capable of controlling the optical output at a low power consumption rate and, more particularly, it relates to a laser diode array device to be suitably used for large capacity optical signal transmission applications such as an optical parallel transmission system.

2. Prior Art

In computer system networks comprising a number of computers connected by optical transmission lines, there has arisen a demand for high quality transmission lines for connecting electronic apparatuses and devices that can meet the requirements of, among others, eliminating troubles such as induction and cross talk, allowing a high density assembly of components and having long distance optical signal transmission capabilities.

The technique of optical serial signal transmission for multiplexed signal transmission and that of optical parallel transmission capable of transmitting signals at an enhanced rate are two remarkable improvements achieved in recent years in the technology of optical signal transmission, of which the latter is attracting attention as a promising technique that can be adapted for large capacity computers.

An optical parallel signal transmission system comprises transmission routes, each of which typically has a plurality of optical fibers that are used as optical transmission lines. A light emitting device and a light receiving device are disposed at each of the opposite terminals of the optical fibers for "electric-optical" and "optical-electric" switching.

An array device is preferably used for such a light emitting device because it is a high density device that accommodates a plurality of elements (4 to 50 channels) within a single chip.

More specifically, a laser diode array device is most preferably used as a light emitting device because of its high capacity for optical signal transmission.

It is known that existing laser diode array devices can undesirably change their optical output level in operation as the threshold current level, light emitting efficiency and other characteristics are often affected by ambient temperature and other environmental factors while emitting light.

In order to avoid fluctuations in the optical output level, there have been proposed devices that are externally provided with a feedback circuit for automatic power control (APC), automatic temperature control (ATC) and/or other additional functional features.

Known laser diode array devices are also accompanied by a problem of a relatively high power consumption rate and therefore there has been a demand for laser diode array device having a low threshold current level and an improved light emitting efficiency.

The above identified demand can be met to a certain extent by reducing the cavity of a laser diode array device and coating it with a dielectric film (high reflection film) having a reflectivity equal to or greater than 80%. With such arrangements, laser emitted from the light emitting terminal surface of the device can be oscillated with an improved efficiency.

Proposed means for feeding back the optical output of a laser diode array device include the following.

Current injection method—This is a method of picking up part of light being emitted by a laser diode array device and monitoring the optical output of the device by a photo-detector so that any fluctuations in the level of optical output of the device can be compensated by injecting an electric current into the device.

Separation method—This is a method of dividing part of the stripe-shaped oscillator of a laser diode array device into two section by etching; one for oscillation in the direction of the stripe and the other for oscillation in a direction perpendicular to that of the stripe so that the former may be used as an oscillating section and the other as a light reception monitor section for observing the optical output of the device.

PROBLEMS TO BE SOLVED BY THE INVENTION

The performance of known laser diode array devices cannot be, however, satisfactorily improved by any of the above described methods because of the following technological problems to be solved.

(1) Provision of a feedback circuit arranged in the laser diode array link of a laser diode array device that is required to be highly densely assembled is not feasible because the circuit consumes power and generates heat at a relatively high rate.

(2) The use of the above described current injection method is hardly feasible because of a remarkable reduction in the efficiency of optical oscillation which is inevitable when the reflectivity of high reflection film is suppressed to equal to or lower than 80% and the emitted light is partly diverted by a reflective terminal plate and because it is practically impossible to mount a photodetector on a laser diode array device where elements are arranged at a fine pitch of approximately 250 μm.

(3) If the separation method is employed, the monitor section will show a poor sensitivity to light which is less than half of that of an ordinary photodiode because of the small allowable surface area of the light reception monitor.

It is an antinomic proposition to increase the quantity of light diverted to the light reception monitor without reducing the reflectivity of the high reflection film located in the oscillating section.

(4) Since the light emitting characteristics of the oscillating section of the external monitor laser diodes do not necessarily agree with those of the laser diode array device provided with the external monitor laser diodes and used for signal transmission, the level of output signals of the laser diode array device cannot be rigorously controlled by controlling the oscillating sections of the monitor laser diodes.

(5) Since the light emitting surface of the external monitor laser diodes and that of the laser diode array device for signal transmission are processed in different ways, the former being formed by etching whereas the latter being prepared by cleavage, they inevitably have different sets of light emitting characteristics and, consequently, it is hardly expected that the yield of manufacture of such products is remarkably improved.

Additionally, a problem of deteriorated light emitting characteristics can arise when a lens array is mounted on the reflecting surface (cleaved surface) of a laser diode array device because the surface can be damaged during the mounting operation.

In view of the above identified technological problems, it is therefore an object of the present invention to provide a laser diode array device that can rigorously control its optical outputs at a low power consumption level for bulk optical transmission and allows a high density assembly of components and a high yield of manufacture.

SUMMARY OF THE INVENTION

According to a first aspect of the invention, the above object is achieved by providing a monolithic laser diode array device comprising a plurality of laser diode elements, characterized in that some of said laser diode elements are used as monitor laser diode elements for controlling the optical outputs of the remaining laser diode elements.

Those laser diode elements of the laser diode array device that are not used as monitor elements are for signal transmission.

Each of said monitor laser diode elements has an oscillating section and a light reception monitor section which are separated from each other.

The oscillating section of each of said monitor laser diode elements has a reflecting terminal surface shared with each of the laser diode elements for signal transmission.

The oscillating section of each of the laser diode elements for signal transmission and the monitor laser diode elements has an stripe of active layer which is 100 to 250 $\mu$m long.

According to a second aspect of the invention, the above object is achieved by providing a monolithic laser diode array device comprising monitor elements consisting of monitor laser diode elements and monitor photodiode elements and a plurality of laser diode elements for signal transmission as integral parts thereof, characterized in that said laser diode elements for signal transmission and said monitor laser diode elements are produced in the form of resonant cavities having a same length, each being provided with a reflecting surface disposed at an end thereof and made of a same and single high reflection film.

FUNCTION

The laser diode elements of a monolithic laser diode array device according to the first aspect of the invention have substantially identical light emitting characteristics.

in a laser diode array device for driving a plurality of laser diode elements according to the first aspect of the invention, the optical output of all the laser diode elements of the device can be controlled by controlling only fluctuations in the optical output of the monitor laser diode elements if given laser diode elements operate as monitor laser diode elements for controlling the optical output of the remaining laser diode elements.

As the reflectivity of the terminal reflecting surface of each of the laser diode elements of a device as described above does not need to be reduced, the total power consumption of the device can be significantly lower than that of a device where each of the laser diode elements needs to be controlled individually. In a laser diode array device according to the first aspect of the invention, only a small space will be required for mounting laser diode elements to increase the density of assembly of components as the provision of separately arranged photodetectors is not required if each of a given number of laser diode elements is divided into an oscillating section and a light receiving monitor section.

With such an arrangement, the quantity of light diverted to the light reception monitor section can be increased because the oscillating section of each of the monitor laser diode elements does not need a reflection film having a high reflectivity.

The light emitting characteristics of the monitor laser diode elements and those of the laser diode elements for signal transmission will be substantially same if the oscillating section of each of the monitor laser diode elements has a common terminal reflecting surface shared with each of the laser diode elements for signal transmission.

With such an arrangement, the light emitting characteristics of the laser diode elements for signal transmission and those of the monitor laser diode elements of such a device will show little difference if the oscillating section of each of the laser diode elements for signal transmission and the monitor laser diode elements comprises a stripe of active layer having a length between 100 and 250 $\mu$m.

Similarly, the light emitting characteristics of the laser diode elements for signal transmission and those of the monitor laser diode elements of a laser diode array device according to the second aspect of the invention will show little difference because they are prepared in the form of resonant cavities having a same length, each being provided with a reflecting surface disposed at an end thereof and made of a same and single high reflection film.

Thus, the light emitting characteristics of the laser diode elements for signal transmission can be properly controlled by feeding any fluctuations detected in the light emitting characteristics of the monitor laser diode elements back to the laser diode elements for signal transmission.

Now, the present invention will be described by referring to the accompanying drawings that illustrate preferred embodiments of the invention.

DETAILED DESCRIPTION OF THE INVENTION

Figure 1:
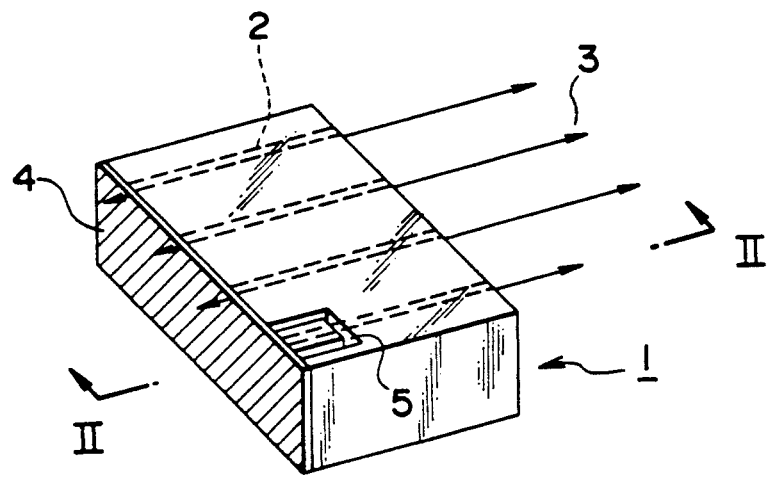
FIG. 1 is a schematic perspective view of a first embodiment of laser diode array device of the invention.
Figure 2:
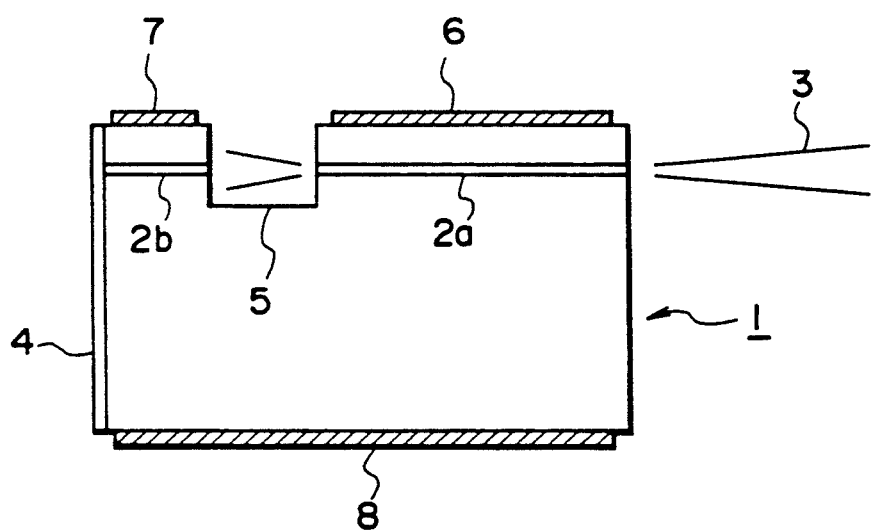
FIG. 2 is a sectional view of the embodiment of FIG. 1 cut along line II—II.

FIGS. 1 and 2 illustrate a first preferred embodiment of laser diode array device of the invention.

A laser diode array device as illustrated in FIGS. 1 and 2 comprises an InP-type or GaAs-type semiconductor substrate and four stripes of active layer 2 disposed in parallel on the substrate, respectively adapted for required wavelengths of light to be emitted and formed by means of a known epitaxial growth technique.

In other words, four laser diode elements are monolithically formed in a laser diode array device 1 of FIGS. 1 and 2.

Additionally, the laser diode array device of FIGS. 1 and 2 is cleaved to form an oblong cavity having a length of approximately 200 μm for oscillation by a low threshold level electric current and provided on its terminal reflecting surface with a high reflection film 4 having a reflectivity of 90% and comprising an amorphous silicon film and a silicon oxide film formed by an appropriate film formation means.

A groove 5 having a U-shaped cross section is formed to a width of 50 μm and a depth of 5 μm by dry etching on an arbitrarily selected one, or stripe 2, of the stripes of active layer to divide it into an active layer stripe 2a and a light reception monitor section 2b.

Thus, the laser diode array device 1 is provided with a monitor laser diode element comprising an active layer stripe 2a and a light reception monitor stripe 2b.

The light reception monitor stripe 2b of the monitor laser diode element is electrically insulated from the active layer stripe 2a.

In FIGS. 1 and 2, reference numeral 3 denotes an optical output, 6 a laser diode electrode, 7 a light reception monitor electrode and 8 a common electrode.

Referring to FIGS. 1 and 2, when an electric current is made to flow in said laser diode array device 1 from the laser diode electrode 6 in order to oscillate the device 1, the optical output of the active layer stripe 2a generated as a result of the oscillation is received by the light reception monitor stripe 2b to generate an optical current in the light reception monitor electrode 7.

Since the optical output of the active layer stripe 2a has light emitting characteristics (including those that are temperature-dependent) similar to those of the optical output of the other stripe 2 of active layer, the optical output of the other stripe 2 of active layer is stabilized to show a constant level by controlling the electric current injected into the laser diode electrode 6 in such a manner that the optical current of the light reception monitor electrode 7 is kept to a constant level.

In an experiment conducted on a laser diode array device identical with the embodiment of FIGS. 1 and 2 and a conventional laser diode array device to determine their respective power consumption rates, it was found that the power consumption rate of the conventional device for a 10 channel link was 3 W, of which approximately 1 W was consumed for APC feedback, whereas the device of the invention consumed only a tenth of 1 W for APC feedback and its overall power consumption rate was approximately two thirds of that of the conventional device, evidencing an excellent performance of the device of the invention.

For a laser diode array device 1 as illustrated in FIGS. 1 and 2, a monitor laser diode element (comprising an active layer stripe 2a and a light reception monitor stripe 2b) is preferably disposed on a or both sides of the laser diode array device 1 in order to make it easy to be connected with an optical fiber and enhance the accuracy of the connection of the optical fiber and the device.

Now, a second embodiment of laser diode array device of the present invention will be described by referring to FIGS. 3 and 4.

Figure 3:
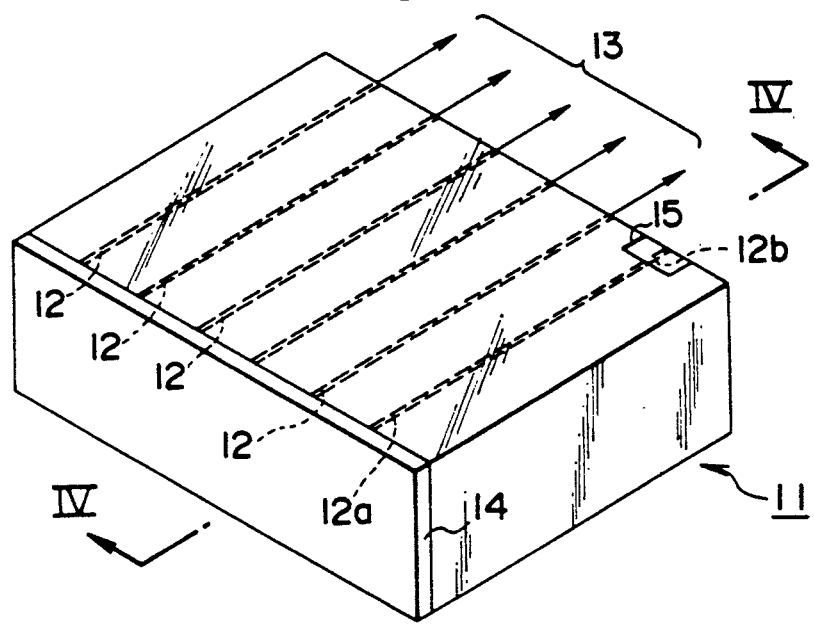
FIG. 3 is a schematic perspective view of a second embodiment of laser diode array device of the invention.
Figure 4:
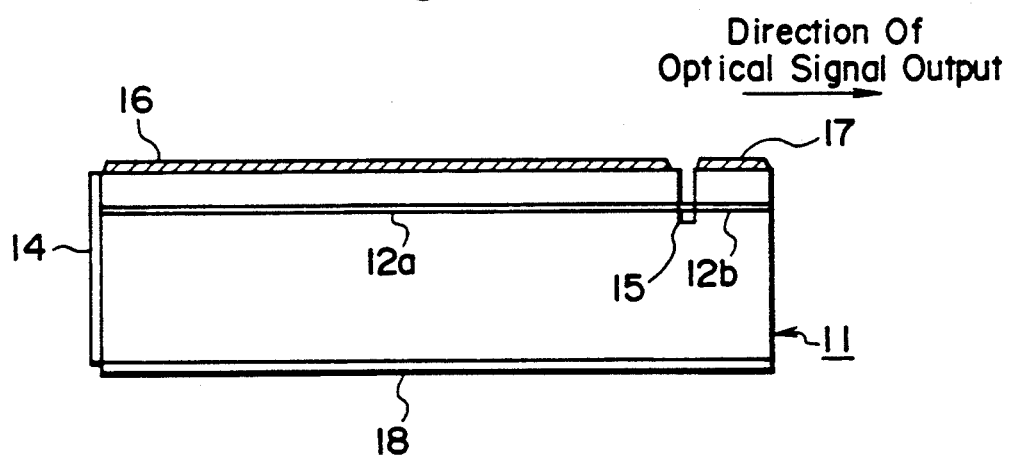
FIG. 4 is a sectional view of the embodiment of FIG. 3 cut long line IV—IV.

As in the case of the above described first embodiment, the laser diode array device 11 of FIGS. 3 and 4 comprises an InP-type or GaAs-type semiconductor substrate and four stripes of active layer 12 for signal transmission disposed on the substrate, respectively adapted for required wavelengths of light to be emitted and formed by means of a known epitaxial growth technique.

In other words, four laser diode elements are monolithically formed in a laser diode array device 11 of FIGS. 3 and 4.

Additionally, the laser diode array device of FIGS. 3 and 4 is cleaved to form an oblong cavity having a length of approximately 200 μm for oscillation by a low threshold level electric current and provided on its terminal reflecting surface with a high reflection film 14 having a reflectivity of 90% as in the case of the first embodiment.

Besides, a groove 15 having a U-shaped cross section is formed to a width of 20 μm and a depth of 10 μm by etching on an arbitrarily selected one, or stripe 12, of the stripes of active layer to divide it into an active layer stripe 12a and a light reception monitor section 12b. Thus, the laser diode array device 11 is provided with a monitor laser diode element 12 comprising an active layer stripe 12a and a light reception monitor stripe 12b.

The light reception monitor stripe 12b of the monitor laser diode element is electrically insulated from the active layer stripe 12a.

Both of the active layer stripes 12 and 12a of the laser diode array device 11 in FIGS. 3 and 4 have a length between 100 and 250 μm and substantially identical light emitting characteristics.

In FIGS. 3 and 4, reference numeral 13 denotes an optical output, 16 a laser diode electrode, 17 a light reception monitor electrode and 18 a common electrode.

Referring to FIGS. 3 and 4, when an electric current is made to flow in said laser diode array device 11 from the laser diode electrode 16 in order to oscillate the device 11, the optical output of the active layer stripe 12a generated as a result of the oscillation is received by the light reception monitor stripe 12b to generate an optical current in the light reception monitor electrode 17.

In this case again, the optical output of the active layer stripe 12a has light emitting characteristics similar to those of the optical output of the other stripe 12 of active layer.

Therefore, the optical output of the other stripe 12 of active layer is stabilized to show a constant level by controlling the electric current injected into the laser diode electrode 16 in such a manner that the optical current of the light reception monitor electrode 17 is kept to a constant level.

The length of the active layer stripe 12 an that of the stripe 12a are found between 100 and 250 μm on the basis of the following findings which will be described by referring to FIGURE.

Figure 5:
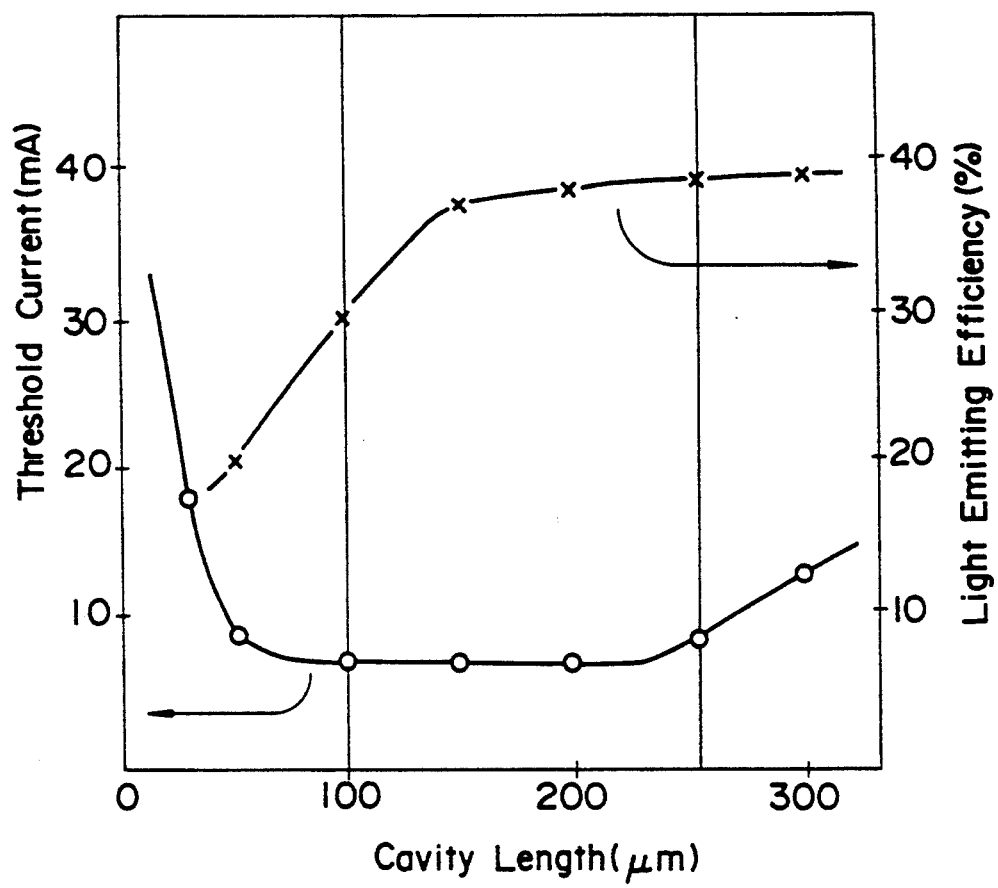
FIG. 5 is a graph showing the fluctuations in the threshold current and the light emitting efficiency of the second embodiment of FIG. 4 observed when the cavity length is varied.

FIG. 5 is a graph showing the fluctuations in the threshold current and the light emitting efficiency of the second embodiment of FIG. 4 observed when the cavity length (which corresponds to the length of either of the active layer stripes) is varied.

It is apparent from FIG. 5 that the threshold current is stable when the cavity length is between 50 and 250 μm and the light emitting efficiency is in a saturation stabilization state when the cavity length is equal to or greater than 100 μm (preferably equal to or greater than 150 μm).

Thus, so long as the length of the active layer stripe 12 and that of the active layer stripe 12a are found between 100 and 250 μm, the light emitting characteristics of these stripes 12 and 12a remain substantially unchanged regardless of their lengths.

For a laser diode array device 11 as illustrated in FIGS. 3 and 4, again, it is preferable that a monitor laser diode element is disposed on a or both sides of the laser diode array device 11 in order to make it easy to be connected with an optical fiber and enhance the accuracy of the connection of the optical fiber and the device.

Now, a third embodiment of laser diode array device of the present invention will be described by referring to FIGS. 6 and 7.

Figure 6:
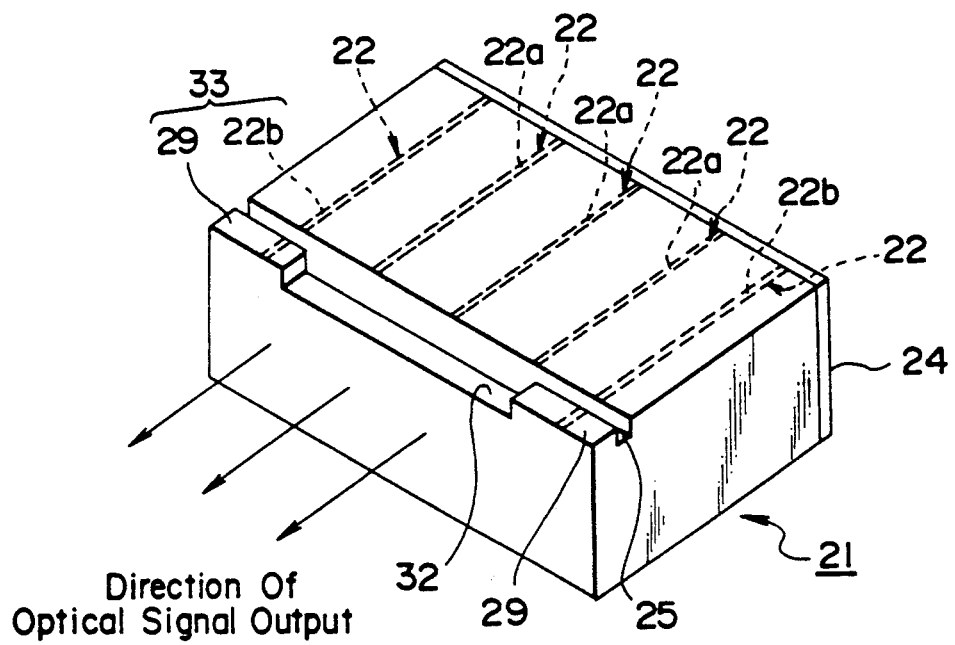
FIG. 6 is a schematic perspective view of a third embodiment of laser diode array device of the invention.
Figure 7:
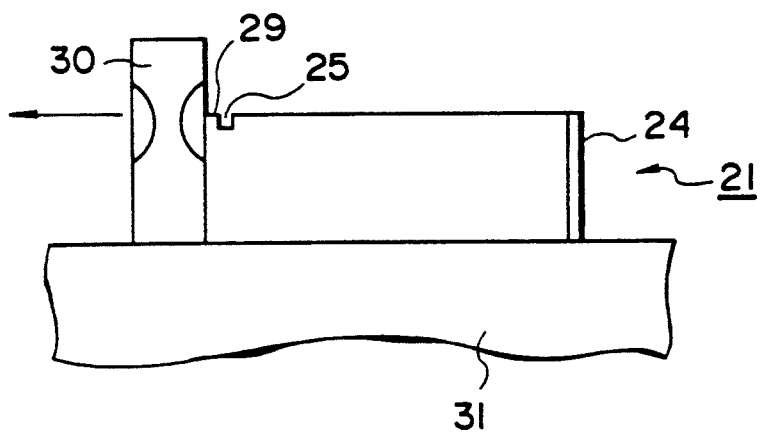
FIG. 7 is a lateral view of the third embodiment of laser diode array device of the invention provided with a lens array.

In FIGS. 6 and 7, a laser diode array device 21 and a microlens array 30 are disposed on a carrier 31 and, more specifically, the laser diode array device 21 is provided on one of its terminals with the microlens array 30.

The laser diode array device 21 comprises laser diode elements 22a for signal transmission prepared from respective laser diode active layer stripes 22, monitor laser diodes 22b, monitor photodiodes 29, a high reflection film 24 made of a dielectric film, a groove 25 and a recess 32, said groove 25 and recess 32 being formed by etching.

A laser diode array device 21 having a configuration as shown in FIGS. 6 and 7 can be prepared by way of a process as described below.

Firstly, multiple channel type laser diode active layer stripes 22 adapted to emit light of required respective wavelengths are formed on an InP-type or GaAs-type semiconductor substrate by means of a known epitaxial growth method and a known stripe forming method.

Then, a groove 25 as wide as 20 μm is formed near and end of the device perpendicularly to said multiple channel type laser diode active layer stripes 22 by dry or wet etching.

As the groove 25 is formed, each of the laser diode active layer stripes 22 is divided into laser diode elements 22a for signal transmission, monitor laser diode elements 22a and monitor photodiode elements 29.

Thereafter, since no monitor photodiode elements 29 are required for the laser diode elements 22a for signal transmission, the monitor photodiode elements 29 corresponding to the laser diode elements 22a are removed by forming a recess 32 by means of a known etching technique.

Thus, a monitor element 33 consisting of monitor laser diode elements 22b and monitor photodiode elements 29 takes shape along with the laser diode elements 22a for signal transmission.

The laser diode elements 22a for signal transmission and the monitor laser diode elements 22b have a same and equal resonant cavity length as well as light emitting terminals disposed on a same plane.

Note that the monitor photodiode elements 29 have a length between 20 and 50 μm in order to secure a permissible minimum sensitivity, whereas the laser diode elements 22a for signal transmission and the monitor laser diode elements 22b have a length of 200 μm in order to provide a low threshold level for the laser oscillation current and the groove 25 is made deeper than 10 μm in order to prevent any noises from occurring as optical signals are reflected by its etched surface.

If a laser diode array device 21 as described above is required to have as many as twenty channels, it will be so formed each channel is provided at one or both of its ends with a monitor photodiode element 29, which is then searched from the channel by dicing or cleaving.

Then, a multilayered high reflection film 24 comprising, as described earlier, an amorphous silicon film and a silicon oxide film is formed by using a known film forming technique on the surface of the substrate where the light emitting terminals of the laser diode elements 22a for signal transmission and the monitor laser diode elements 22b are located.

The high reflection film 24 needs to show a reflectivity of approximately 90% in order to lower the threshold current level for laser oscillation and improve the light emitting efficiency and other properties of the device.

Required electrodes are then formed on a laser diode array device 21 as described above in a following manner.

The carrier 31 is made of a thermally conductive material such as copper-tungsten, silicon carbide or silicon nitride and has a thermal expansion coefficient substantially equal to that of the semiconductor substrate of the laser diode array device.

The carrier 31 is securely bonded to the semiconductor substrate by using gold-tin solder or lead-tin solder to form an electrode.

Then, a gold wire having a diameter of 25 μm is heat-press bonded to the carrier between said electrode and a lead electrode.

Thereafter, an electrode is independently formed on each of the laser diode elements 22a for signal transmission and the monitor laser diode elements 22b.

The microlens array 30 comprises a plurality of lenses corresponding to the respective laser diode elements 22a for signal transmission.

As seen from FIG. 7, the microlens array 30 is made to abut a surface of the device where the monitor photodiode elements 29 are located and then rigidly secured to its proper position so that incoming optical signals may be most effectively taken into the device.

When mounted, the microlens array 30 and the light emitting terminal surfaces of the laser diode elements 22a for signal transmission that have been formed by etching are separated from one another by the groove 25.

This means that the light emitting terminal surfaces of the laser diode elements 22a for signal transmission would not be damaged by the microlens array 30 to degrade their quality.

A laser diode array device 21 as described above and illustrated in FIGS. 6 and 7 operates for laser when an electric current is injected through a given electrode and the optical output of the laser diode elements 22a for signal transmission passes through the microlens array 30.

Since the laser diode elements 22a for signal transmission and the monitor laser diode elements 22b of such as laser diode array device 21 have a same and identical resonant cavity length and the resonant cavities are provided with a common reflecting surface of a high reflection film 24 at an end and an opposite common reflective surface formed by etching at the other end, all the laser diode elements 22a for signal transmission and the laser diode elements 22b have substantially identical light emitting characteristics.

Therefore, by feeding back fluctuations in the light emitting characteristics of the monitor laser diode elements 22b to the laser diode elements 22a for signal transmission, the light emitting characteristics of the latter can be appropriately controlled.

ADVANTAGES OF THE INVENTION

As is apparent from the above detailed description, a monolithic laser diode array device according to the first aspect of the invention comprises a plurality of laser diode elements, some of which are formed as monitor laser diode elements for controlling the optical output of the remaining laser diode elements so that the device can operate at a power consumption rate by far lower than that of a conventional laser diode array device where the component laser diode elements needs to be individually controlled, while it can be assembled to an enhanced density.

If a laser diode array device according to the first aspect of the invention is so formed that the oscillating sections of the monitor laser diode elements share a common reflecting terminal surface with those of the laser diode elements for signal transmission, each of the laser diode elements for signal transmission and the monitor laser diode elements shows substantially same and identical light emitting characteristics. If, additionally, all the oscillating sections of the laser diode elements for signal transmission and the monitor laser diode elements have an active layer stripe with a length between 100 and 250 μm, the differences among the light emitting characteristics of the laser diode elements are minimized.

A monolithic laser diode array device according to the second aspect of the invention comprises laser diode elements for signal transmission and monitor diode elements realized in the form of resonant cavities having a same length and sharing a common reflecting surface of a high reflection film disposed at an end thereof so that the laser diode elements for signal transmission and the monitor laser diode elements show substantially identical light emitting characteristics.

Thus, the light emitting characteristics of the laser diode elements for signal transmission can be appropriately controlled by feeding back fluctuations in the light emitting characteristics of the monitor laser diode elements to the laser diode elements for signal transmission.

What is claimed is:

1. A monolithic laser diode array device comprising a plurality of laser diode elements arranged so as to define separate and substantially parallel channels, at least one outermost laser diode element of said plurality of laser diode elements being a monitor laser diode element for generating photocurrents that control the optical outputs of the remaining laser diode elements, said plurality of laser diode elements having a common resonant length and a common reflection surface.

2. A laser diode array device according to claim 1, wherein the laser diode elements that are not used as monitor elements are used for signal transmission.

3. A laser diode array diode device according to claim 1, wherein each of said monitor laser diode elements has an oscillating section and a light reception monitor section which are separated from each other.

4. A laser diode array device according to claim 3, wherein the oscillating section of each of the laser diode elements for signal transmission and the monitor laser diode elements has an stripe of active layer which is 100 to 250 μm long.

5. A monolithic laser diode array device comprising monitor elements consisting of monitor laser diode elements and monitor photodiode elements and a plurality of laser diode elements for signal transmission as integral parts thereof, characterized in that said laser diode elements for signal transmission and said monitor laser diode elements are produced in the form of resonant cavities having a same length, said laser diode elements and said monitor laser diode elements having a common reflecting surface disposed at an end thereof and made of a same and single reflection film, so that microcurrents form one of said monitor elements controls more than one of said laser diode elements for signal transmission.

6. The monolithic laser diode array device of claim 5, wherein said monitor elements are located on opposite lateral sides of said monolithic laser diode array device with said plurality of laser diode elements for signal transmission being located therebetween.

* * * * *